(12) United States Patent
Biber et al.

(10) Patent No.: US 8,055,196 B2
(45) Date of Patent: Nov. 8, 2011

(54) ARRANGEMENT TO TRANSMIT MAGNETIC RESONANCE SIGNALS

(75) Inventors: Stephan Biber, Erlangen/Frauenaurach (DE); Jan Bollenbeck, Eggolsheim (DE); Ralph Oppelt, Uttenreuth (DE); Markus Vester, Nuernberg (DE)

(73) Assignee: Siemens Aktiengesellschaft, Munich (DE)

( * ) Notice: Subject to any disclaimer, the term of this patent is extended or adjusted under 35 U.S.C. 154(b) by 304 days.

(21) Appl. No.: 12/465,147

(22) Filed: May 13, 2009

(65) Prior Publication Data

US 2009/0286478 A1 Nov. 19, 2009

(30) Foreign Application Priority Data

May 14, 2008 (DE) .......................... 10 2008 023 467

(51) Int. Cl.
*H04B 7/00* (2006.01)
(52) U.S. Cl. ............ 455/41.2; 455/39; 455/41.3; 455/82
(58) Field of Classification Search .............. 455/39–48, 455/59–90
See application file for complete search history.

(56) References Cited

U.S. PATENT DOCUMENTS 5,272,437 A * 12/1993 Wardenier ..................... 324/322
5,319,309 A * 6/1994 den Boef et al. .............. 324/309
5,572,130 A * 11/1996 Ratzel ............................. 324/318
2008/0111552 A1 * 5/2008 Brune et al. .................. 324/326
2009/0115396 A1 * 5/2009 Allen et al. ................. 324/76.25

\* cited by examiner

*Primary Examiner* — Lincoln Donovan
*Assistant Examiner* — Brandon Cole
(74) *Attorney, Agent, or Firm* — Schiff Hardin LLP

(57) ABSTRACT

An arrangement for transmitting magnetic resonance signals, with a transmission link that connects a local coil with a receiver, has a first channel of the local coil with a first single antenna to acquire a first magnetic resonance signal, as well as a first mixer connected with the first single antenna. The first mixer forms an intermediate-frequency first signal from the supplied first magnetic resonance signal. A second channel of the local coil has a second single antenna to acquire a second magnetic resonance signal, as well as a second mixer connected with the second single antenna. The second mixer forms an intermediate-frequency second signal from the supplied second magnetic resonance signal. The local coil has a device for signal combination that, by frequency multiplexing, that combines the intermediate-frequency first signal of the first channel and the intermediate-frequency second signal of the second channel so that it arrives at the receiver via the transmission path. The receiver has an A/D converter at which one of the transmitted intermediate-frequency signals of an associated channel arrives in order to be sampled with a sampling frequency for digitization. For frequency conversion, a first local oscillator frequency is connected at the first mixer and a second local oscillator frequency is connected at the second mixer. the first and second local oscillator frequencies are selected such that intermediate-frequencies formed by the frequency conversion are mirror-symmetrical relative to the sampling frequency of the A/D converter.

9 Claims, 7 Drawing Sheets

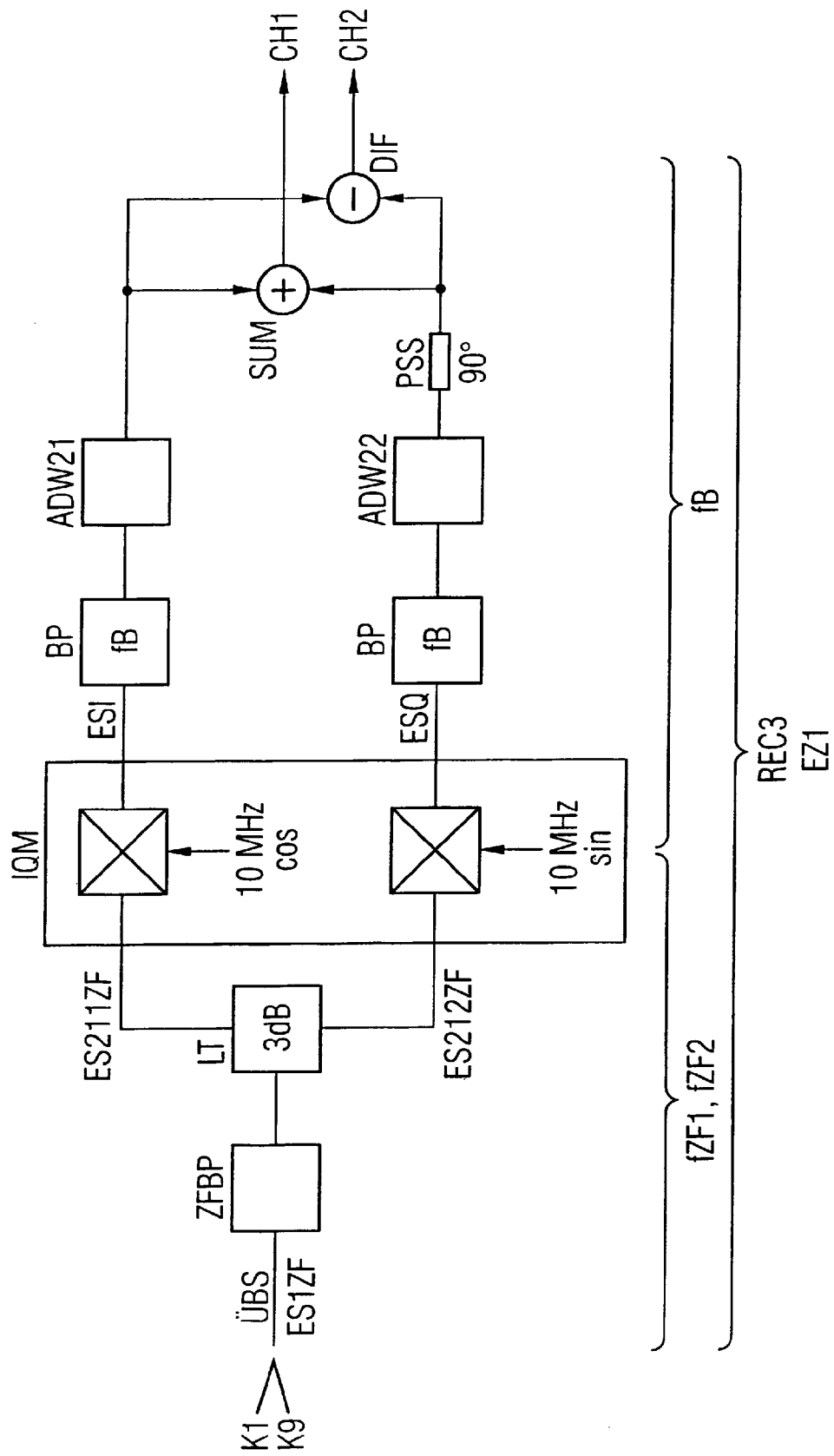

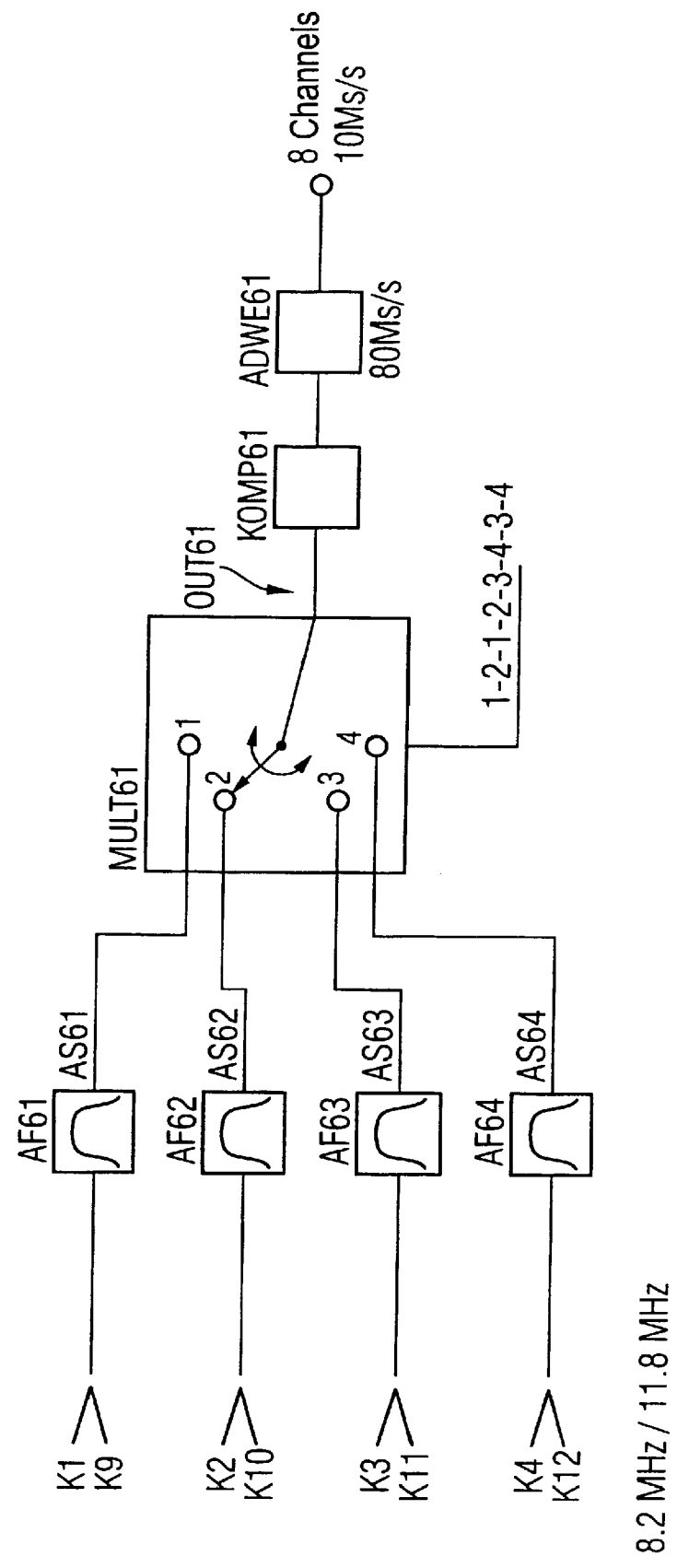

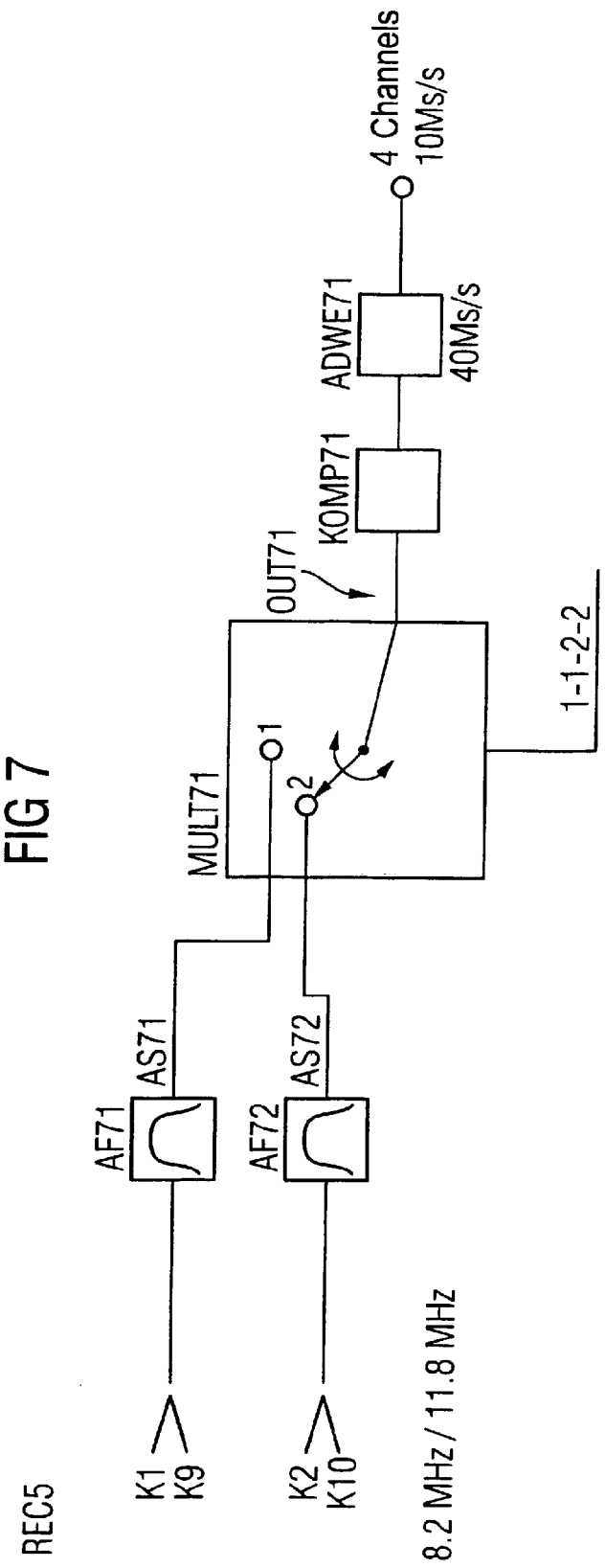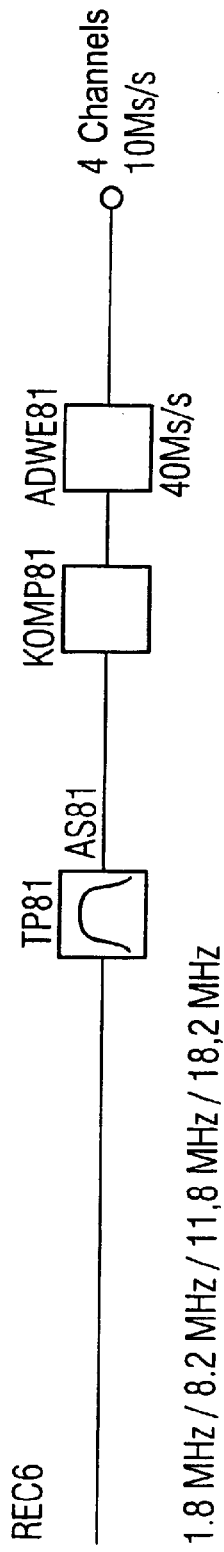

ARRANGEMENT TO TRANSMIT MAGNETIC RESONANCE SIGNALS

BACKGROUND OF THE INVENTION

1. Field of the Invention

The present invention concerns an arrangement to transmit magnetic resonance signals that are acquired by local coils.

2. Description of the Prior Art

Modern magnetic resonance systems simultaneously acquire a number of magnetic resonance signals via local antennas that are placed on the patient. These local antennas are components of what is known as a "local coil". The acquired magnetic resonance signals are pre-amplified, conducted away from a central region of the magnetic resonance system and supplied to a shielded receiver in order to be used therein for image processing.

The connection lines used for transmission are generally directed within a movable patient bed and are therefore several meters in length. The technical problems described below result due to the use of connection lines.

The cables exhibit attenuations in the frequency range of the magnetic resonance signals to be transmitted; these attenuations must be taken into account in designing the signal transmission path. For this purpose, a patient-proximal pre-amplification of the magnetic resonance signals and ensue before the transmission. This causes heat to be generated in proximity to the patient. To avoid such heat generations, low-attenuation cables are presently used for transmission but these have a large cable diameter and are correspondingly unwieldy.

Each local antenna forms an acquisition channel that has a connection cable associated with it for transmission of the magnetic resonance signal. An unwieldy cable bundle is likewise formed by the number of acquisition channels; the cable bundle is subjected to increased mechanical loads due to the movement of the patient bed, even given the use of cable plugs on the bed.

The problem of the cited cable bundle is aggravated by the fact that at least a part of is the cable bundle in part in the radio-frequency field of the magnetic resonance transmission antenna and therefore must contain sheath wave barriers. Due to the dimensions of such items, the cable bundle thickness is again additionally, significantly increased.

Previously used coaxial multiconductor plugs are expensive in the wiring process and unwieldy in use for the operating personnel.

Previously used pre-amplifiers must exhibit a high linearity of the amplifier characteristic curve over a large range in order to form low-distortion output signals. This requires a high power draw and thus produces high waste heat near the patient.

Presently broadband receivers are used that can receive magnetic resonance signals that emanate not only from hydrogen but also from other atoms. Such receivers have a transmission network that contains ferrite cores. Due to the ferrite cores, the receiver cannot be operated in the immediate environment of the static basic field of the magnetic resonance apparatus, such that long connection paths are necessary again that lead to the technical problems cited above.

SUMMARY OF THE INVENTION

An object of the present invention is to provide an improved arrangement for transmission of acquired magnetic resonance signals.

The arrangement according to the invention has a transmission path that connects a local coil with a receiver. The local coil is fashioned to acquire magnetic resonance signals. The receiver is fashioned for A/D conversion of the magnetic resonance signals.

A first channel of the local coil has a first single antenna to acquire a first magnetic resonance signal, as well as a first mixer connected with the first single antenna. The first mixer forms an intermediate-frequency first signal from the supplied first magnetic resonance signal.

A second channel of the local coil has a second single antenna to receive a second magnetic resonance signal, as well as a second mixer connected with the second single antenna. The second mixer forms an intermediate-frequency second signal from the supplied second magnetic resonance signal.

The local coil has a device for signal summation that, by frequency multiplexing, combines the intermediate-frequency first signal of the first channel and the intermediate-frequency second signal of the second channel so that it arrives at the receiver via the transmission path. The receiver has an A/D converter at which one of the transmitted intermediate-frequency signals of an associable channel arrives in order to be sampled with a sampling frequency for digitization.

For frequency conversion into a first intermediate-frequency range, a first local oscillator frequency is connected at the first mixer while a second local oscillator frequency is connected at the second mixer for frequency conversion into a second intermediate-frequency range. These are selected such that intermediate-frequencies formed by the frequency conversion lie mirror-symmetrically relative to the sampling frequency or to a multiple of the sampling frequency of the A/D converter.

A receiver-side sampling of the transmitted magnetic resonance signals in the same baseband and at the same frequency position can thereby advantageously ensue so that additional processing is significantly simplified.

A general rule for the selection of the two intermediate-frequency regions of the arrangement according to the invention is as follows:

$$ZF1 = FS + \Delta F$$

$$ZF2 = FS - \Delta F$$

wherein

ZF1 is the first intermediate-frequency range,

ZF2 is the second intermediate-frequency range,

FS is the sampling frequency of an analog-digital converter used at the receiver, which analog-digital converter can be associated with a channel of the local coil, and $\Delta F$ is the frequency interval with a preferred value between 0 and FS/2.

Preferred values for $\Delta F$ lie approximately between $\frac{1}{8}*FS$ and $\frac{3}{8}*FS$ due to the simplified dimensioning of the transmission-side filter that is then enabled.

In an exemplary embodiment, the arrangement according to the invention exhibits a first intermediate-frequency range from 7.5 MHz to 9 MHz and a second intermediate-frequency range from 11 MHz to 12.5 MHz.

Long connection cables are avoided by the frequency-multiplexed transmission according to the invention. By the use of a filter according to the invention for signal summation at the local coil, it is possible to transmit multiple received signals by frequency multiplexing via only one connection line.

The arrangement according to the invention furthermore offers the advantage that necessary RF power for signal transmission via the connection cable can now be provided at a lower frequency, namely that of the intermediate-frequency range. Less DC power is required for this given the same linearity requirement at the amplifier. Less driver power in the amplifiers is required due to the lower cable attenuation in the intermediate-frequency range, whereby DC power can likewise be saved.

The transmission according to the invention has lower requirements on the connections that are used since the intermediate-frequency is distinctly lower than the frequency of the acquired magnetic resonance signals.

For example, it is thereby enabled to use simple plug connectors with single pins instead of expensive, coaxial multi-conductor plugs. These can be designed markedly cheaper and smaller.

Requirements for a cable and plug shielding or for radio-frequency impermeability can be reduced. This results because a feedback of amplified signals to the local antenna is ineffective since signals directed on the connection cable lie in the intermediate-frequency range and therefore no longer lie in the frequency range in which the local antenna and receiver are sensitive.

Due to a transmission according to the invention of multiple acquisition channels via a common connection, costs and structural space can be saved.

Even given multi-nuclei applications, acquisition signals can be mixed in the same intermediate-frequency range due to the frequency conversion according to the invention (which still ensues within the local coil). Only an adaptation of the local oscillator frequency is necessary.

The receiver that is used need be adapted only with regard to the intermediate-frequency bandwidth and can be used for all examined nuclei. Previously required broadband ferrite modules are not needed, thereby enabling the receiver to be positioned in proximity to the magnet and to markedly reduce the cable lengths.

Via the preferably used local oscillator frequencies, resulting intermediate-frequencies are achieved that lie in different aliasing bands of the sampling. The Nyquist bandwidth of the analog-digital conversion that must be observed for frequency multiplexing does not need to be selected greater than that for a system without frequency multiplexing.

The division of the employed intermediate-frequency bands at the receiver preferably ensues via a low-pass/high-pass combination.

Before an analog-digital conversion to be conducted, a bandpass filtering is conducted in order to mask out noise from aliasing bands.

The method described in the following to make an initial spectral separation at the reception side in order to then make the analog-to-digital conversion (comparable to FIG. 2, described below) has the advantage that the analog-digital converter used on the reception side must merely have a higher analog input bandwidth per partial signal, but neither a higher sampling rate nor a higher dynamic range.

The method described in the following to combine initially spectrally separated partial signals into a new signal by a multiplexing method in order to then convert the combined signal from analog to digital (comparable to FIG. 4, described below) has the advantage that the analog-digital converter that is used must have a higher sampling rate but not a greater dynamic range.

BRIEF DESCRIPTION OF THE DRAWINGS

FIG. 5 is a block diagram of a third receiver according to the invention.

FIG. 6 is a block diagram of a fourth receiver according to the invention,

FIG. 7 is a block diagram of a fifth receiver according to the invention.

FIG. 8 is a block diagram of a sixth receiver according to the invention.

DESCRIPTION OF THE PREFERRED EMBODIMENTS

Figure 1:
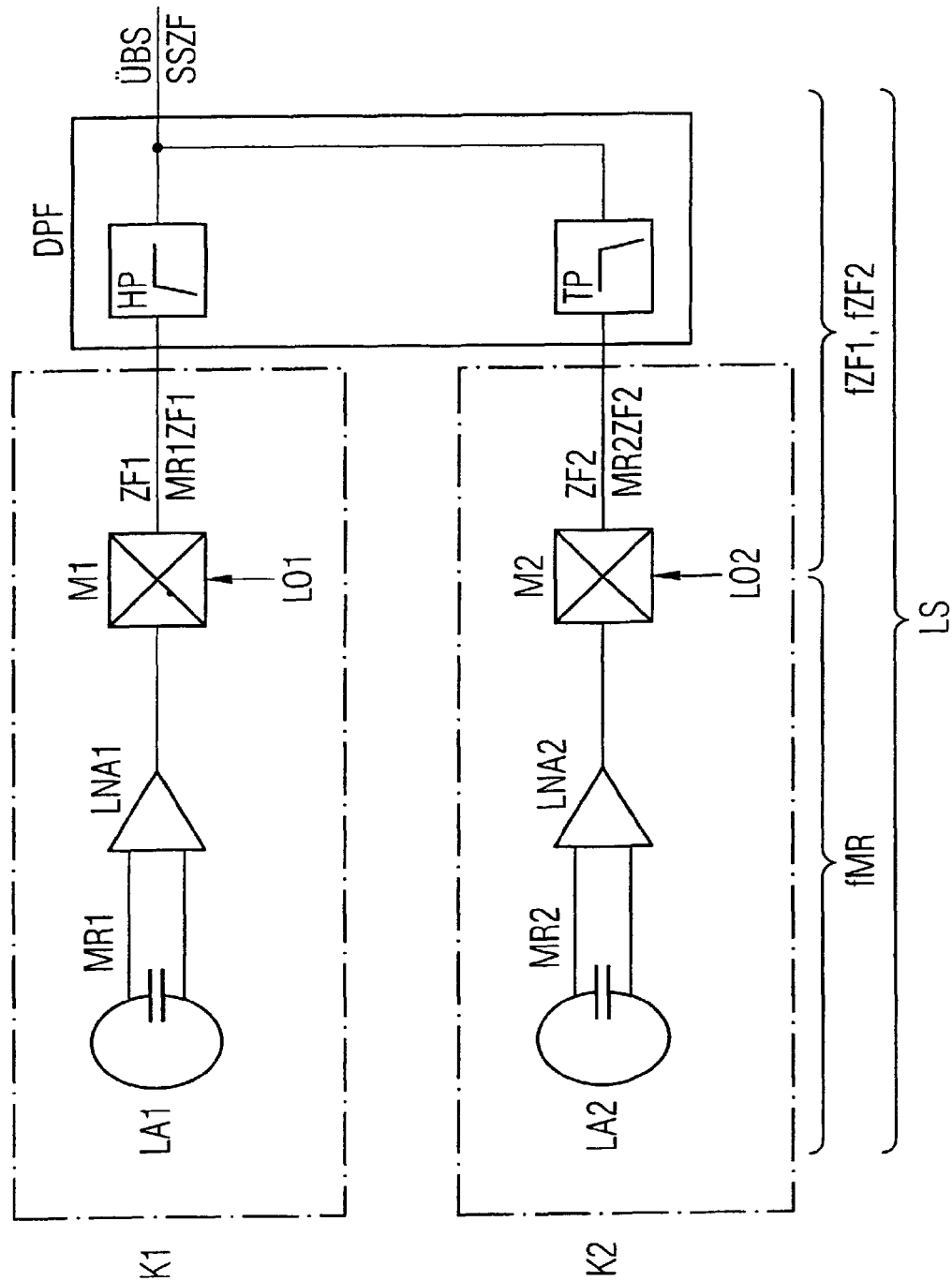
FIG. 1 is a block diagram of a first transmitter according to the invention for the transmission of magnetic resonance signals.

FIG. 1 shows the basic arrangement according to the invention for the transmission of two acquired magnetic resonance signals MR1 and MR2.

A local coil LS has, for example, a first branch or channel K1 and a second branch or channel K2.

The channels K1, K2 respectively contain a single antenna LA1 or LA2 a pre-amplifier LNA1 or LNA2 and a mixer M1 or M2.

A first single antenna LA1 designed as a loop antenna is associated with the first channel K1 while a second single antenna LA2 designed as a loop antenna is associated with the second channel K2.

A first magnetic resonance signal MR1 is acquired via the first single antenna LA1 while a second magnetic resonance signal MR2 is acquired via the first single antenna LA2.

The acquired first magnetic resonance signal MR1 arrives at a first mixer M1 via a first pre-amplifier LNA1 that is designed as a low noise amplifier.

A frequency conversion of the amplified first magnetic resonance signal MR1 into a first intermediate-frequency range ZF1 ensues at the first mixer M1 with the aid of a first local oscillator frequency LO1 connected there. An intermediate-frequency first signal MR1ZF1 is therefore formed.

A frequency conversion of the amplified second magnetic resonance signal MR2 into a second intermediate-frequency range ZF2 ensues at the first mixer M2 with the aid of a second local oscillator frequency LO2 connected there. An intermediate-frequency second signal MR2ZF2 is therefore formed.

The first intermediate-frequency range ZF1 and the second intermediate-frequency range ZF2 lie below the frequency range of the two carrier-frequency magnetic resonance signals MR1 and MR2—a down-mixing thus ensues via the two mixers M1, M2.

The intermediate-frequency first signal MR1ZF1 is supplied to a high-pass branch HP while the intermediate-frequency second signal MR2ZF2 is supplied to a low-pass branch TP.

The high-pass branch HP and the low-pass branch TP are components of a diplex filter DPF with whose help the two signals MR1ZF1 and MR2ZF2 are combined into an intermediate-frequency transmission signal SSZF.

In addition to a signal portion of the first intermediate-frequency range ZF1, the intermediate-frequency transmission signal SSZF therefore also possesses a signal portion of the second intermediate-frequency range ZF2 in the frequency multiplexing.

In a preferred embodiment, ZF1=11.8 MHz is used as a first intermediate-frequency, for example, while ZF2=8.2 MHz is used as a second intermediate-frequency.

A general rule for the selection of the two intermediate-frequency ranges of the arrangement according to the invention is as follows:

$$ZF1=FS+\Delta F$$

$$ZF2=FS-\Delta F$$

wherein

FS is the sampling frequency of an analog-digital converter used at the receiver side, which analog-digital converter can be associated with a transmission-side channel K1 or, respectively, K2, and $\Delta F$ is the frequency interval with a value between 0 and FS/2.

Preferred values for $\Delta F$ lie in the range from FS/8 and 2*FS/8. An advantageous, transmission-side filer dimensioning is thereby enabled.

The transmission signal SSZF is transferred over a transmission link ÜBS to a receiver (not shown).

The transmission link ÜBS can be hardwired or wireless. For hardwired transmission, optical waveguides, coaxial cables, etc. could be used, for example. Infrared or radio transmissions, etc. could be used for wireless transmission.

Figure 2:
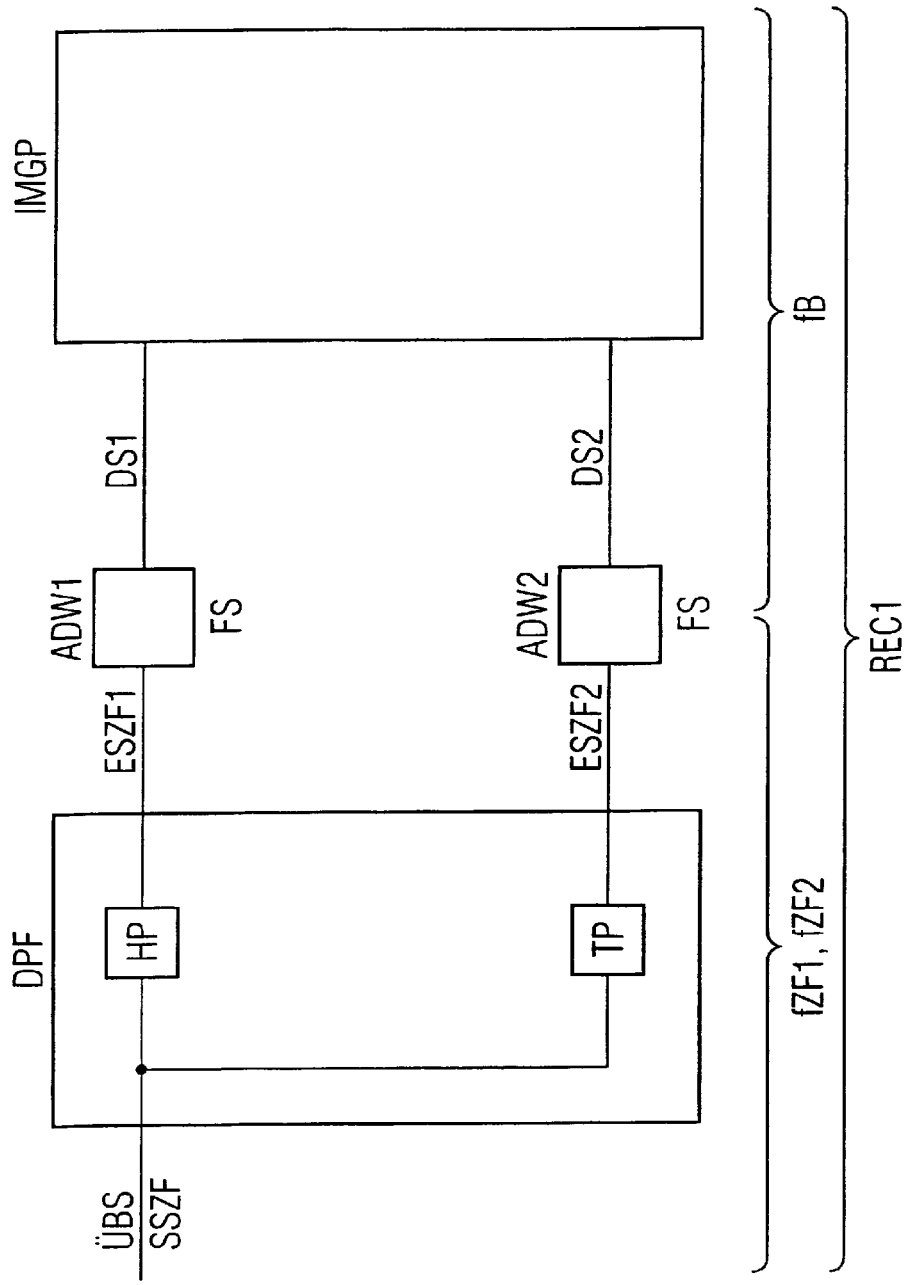
FIG. 2 is a block diagram, with reference to FIG. 1, of a first embodiment of a receiver according to the invention.

FIG. 2 shows a first receiver REC1 according to the invention in a principle representation and with reference to FIG. 1.

The transmission signal SSZF arrives via the transmission link ÜBS at a diplex filter DPF with which the transmission signal SSZF transmitted by means of the frequency multiplexing method is divided up into two intermediate-frequency acquisition signals ESZF1 and ESZF2.

For this purpose the diplex filter DPF contains a high-pass branch HP and a low-pass branch TP in order to form filtered, intermediate-frequency acquisition signals ESZF1 and ESZF2.

It is to be noted that the diplex filter used at the local coil LS and the diplex filter used at the receiver REC1 technically do not have to be exactly identical in design.

The diplex filter DPF used on the part of the local coil LS is reasonably used as a "cleaning filter" or as a "diplex combiner" as described in FIG. 1 while the diplex filter DPF used on the part of the receiver REC1 is reasonably used as a "diplex channel filter" or, respectively, as a "diplex splitter".

An intermediate-frequency first acquisition signal ESZF1 arrives at a first analog-digital converter ADW1 while an intermediate-frequency second acquisition signal ESZF2 arrives at a second analog-digital converter ADW2.

With the aid of the first A/D converter ADW1, a digital first signal DS1 is formed in the baseband range fB from the intermediate-frequency first acquisition signal ESZF1 via sampling with the sampling frequency FS already cited in FIG. 1.

With the aid of the first A/D converter ADW2, a digital first signal DS2 is formed in the baseband range fB from the intermediate-frequency second acquisition signal ESZF2 via sampling with the sampling frequency FS already cited in FIG. 1.

The two signals DS1, DS2 are then supplied to a downstream image processing device (designated as "Image processing").

In summary, in the present invention (here with reference to Figures FIG. 1 and FIG. 2) intermediate-frequency ranges ZF1 and ZF2 are used that are mirror-symmetrical to the sampling frequency FS or, respectively, mirror-symmetrical to a multiple of the sampling frequency FS of an A/D converter ADW1, ADW2 of the receiver REC1.

Furthermore, a down-mixing of the acquired magnetic resonance signals (more precisely once uninverted and once inverted) ensues on the part of the local coil LS. The local oscillator frequencies LO1 and LO2 that are used thereby lie one above and one below the frequency of the magnetic resonance signals MR1 and MR2.

After the scanning at the receiver has occurred, the digitized signals DS1 and DS2 appear uninverted and in the same baseband fB.

Figure 3:
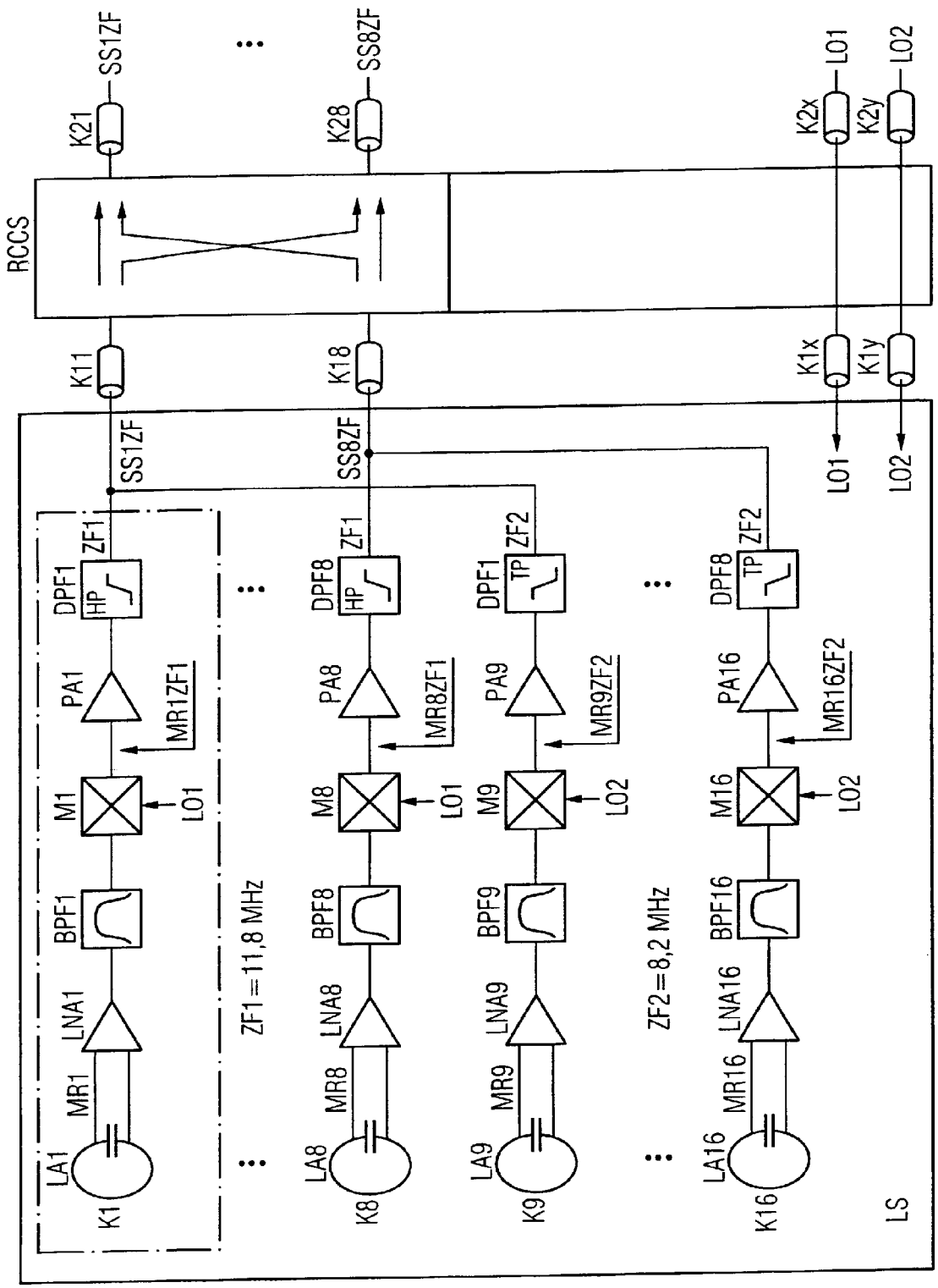
FIG. 3 is a block diagram of a second embodiment of a transmitter according to the invention for the transmission of 16 magnetic resonance signals in total.

In a principle representation, FIG. 3 shows a second transmitter according to the invention for the transmission of 16 magnetic resonance signals in total.

A local coil LS exemplarily possesses sixteen acquisition branches or, respectively, channels K1 through K16 for sixteen acquisition signals MR1 through M16 in total.

The sixteen channels K1 through K16 are designed relatively similarly, as described in the following.

A first channel K1 possesses a first singe antenna LA1 (designed as a loop antenna) via which a first magnetic resonance signal MR1 is acquired.

The acquired first magnetic resonance signal MR1 arrives at a first mixer M1 via a low-noise first pre-amplifier LNA1 and a first bandpass filter BPF1 downstream of said pre-amplifier LNA1.

A frequency conversion of the amplified first magnetic resonance signal MR1 into a first intermediate-frequency range ZF1 ensues at the first mixer M1 with the aid of a first local oscillator frequency LO1 connected there.

ZF1=11.8 MHz is preferably used as a first intermediate-frequency range ZF1, wherein the first intermediate-frequency range ZF1 lies below the frequency range of the carrier-frequency magnetic resonance signal MR1. A down-mixing by the first mixer M1 thus ensues.

An intermediate-frequency first signal MR1ZF1 is formed by the first mixer M1. The intermediate-frequency first signal MR1ZF1 is re-amplified with the aid of an amplifier PA1.

The additional channels K2 through K8 (not shown here in part) are designed comparable to channel K1 and likewise produce a signal conversion into the first intermediate-frequency range ZF1.

An amplified, intermediate-frequency second signal MR2ZF1 is thus formed by a second channel K2 (not shown in detail here). An amplified, intermediate-frequency third signal MR3ZF1 is formed by a third channel K3 (not shown in detail here) etc. until ultimately an amplified, intermediate-frequency eighth signal MR8ZF1 is formed by a the [sic] shown eighth channel K8.

A ninth channel K9 possesses a ninth single antenna LA9 designed as a loop antenna, via which single antenna LA9 a ninth magnetic resonance signal MR9 is acquired.

The acquired ninth magnetic resonance signal MR9 arrives at a ninth mixer M9 via a low-noise ninth pre-amplifier LNA9 and a ninth bandpass filter BPF9 downstream of said pre-amplifier LNA9.

A frequency conversion of the amplified ninth magnetic resonance signal MR9 into a second intermediate-frequency range ZF2 ensues at the ninth mixer M9 with the aid of a second local oscillator frequency LO2 connected there.

ZF2=8.2 MHz is preferably used as a second intermediate-frequency range ZF2, wherein the second intermediate-frequency range ZF2 lies below the frequency range of the carrier-frequency magnetic resonance signal MR9. A down-mixing by the ninth mixer M9 thus ensues.

An intermediate-frequency ninth signal MR9ZF2 is thus formed by the ninth mixer M9.

The intermediate-frequency ninth signal MR9ZF2 is re-amplified with the aid of an amplifier PA9.

The additional channels K10 through K16 (not shown here in part) are designed comparable to channel K9 and likewise produce a signal conversion into the second intermediate-frequency range ZF2.

An amplified, intermediate-frequency tenth signal MR10ZF2 is thus formed by a tenth channel K10 (not shown in detail here). An amplified, intermediate-frequency eleventh signal MR11ZF2 is formed by an eleventh channel K11 (not shown in detail here) etc. until ultimately an amplified, intermediate-frequency sixteenth signal MR16ZF2 is formed by the shown sixteenth channel K16.

Every two intermediate-frequency signals MR1ZF1 through MR16ZF2 are now interconnected [sic] with the aid of eight diplex filters DPF1 through DPF8 and transmitted in pairs with the aid of eight connection cables K11 through K18 (shown here).

The first intermediate-frequency signal MR1ZF1 is thus supplied to a high-pass branch HP of a first diplex filter DPF1 while the ninth intermediate-frequency signal MR9ZF2 is supplied to a low-pass branch TP of the first diplex filter DPF1. An intermediate-frequency first transmission signal SS1ZF is thereby formed.

In addition to the first signal portion of the first channel K1, a second signal portion of the ninth channel K9 (that together form the intermediate-frequency first transmission signal SS1ZF) is therefore present at the output of the first diplex filter DPF1.

Output signals of the first and ninth channel K1, K9 are thus combined by means of frequency multiplexing with the aid of the first diplex filter DPF1.

The additional channels K1 through K8 and K10 through K16 (not all shown) are wired analogously. The following chart thus results:

| Channel | with Channel | via Diplex Filter | yields: |
| --- | --- | --- | --- |
| K1/ZF1 | K9/ZF2 | DPF1 | SS1ZF |
| K2/ZF1 | K10/ZF2 | DPF2 | SS2ZF |
| K3/ZF1 | K11/ZF2 | DPF3 | SS3ZF |
| K4/ZF1 | K12/ZF2 | DPF4 | SS4ZF |
| K5/ZF1 | K13/ZF2 | DPF5 | SS5ZF |
| K6/ZF1 | K14/ZF2 | DPF6 | SS6ZF |
| K7/ZF1 | K15/ZF2 | DPF7 | SS7ZF |
| K9/ZF1 | K16/ZF2 | DPF8 | SS8ZF |

The first transmission signal SS1ZF here is exemplarily directed via a first transmission cable K11 to a distributor device RCCS that is designed as a crossbar distributor.

A signal bypass to a selected receiver branch (as is subsequently described by way of example in FIG. 4) can ensue with the aid of the distributor device RCCS.

The eighth transmission signal SS8ZF is correspondingly supplied via an eighth transmission cable K18 to the distributor device RCCS.

Signals from sixteen channels K1 through K16 are thus respectively combined in pairs and transmitted to the distributor device RCCS.

The first local oscillator frequency LO1 and the second local oscillator frequency LO2 are supplied to the local coil LS, wherein transmission cables K1$x$, K1$y$, K2 and K2$y$ are used.

The primary function of the bandpass filters BPF1 through BPF16 is to suppress image band noise. For example, a mixer with a local oscillator frequency LO=115 MHz and an intermediate-frequency range ZF=8.2 MHz also receives at an unwanted 106.8 MHz in addition to the desired 123.2 MHz.

A mixer with a local oscillator frequency LO=135 MHz and an intermediate-frequency range ZF=11.8 MHz also receives at an unwanted 146.8 MHz in addition to the desired 123.2 MHz.

Therefore similar bandpass filters that mask out frequencies below approximately 110 MHz and above approximately 140 MHz are advantageously used in the respective channels.

The bandpass filter BPFx moreover satisfies the function of what is known as a "cable trap" and therefore serves to balance the respective associated singe antennas, and to avoid interfering sheath waves within the respective branch.

Comparable to FIG. 1, here two intermediate-frequency ranges ZF1 and ZF2 are also used that lie mirror-symmetrically relative to the sampling frequency FS or, respectively, mirror-symmetrically relative to a multiple of the sampling frequency FS of an A/D converter arranged at the receiver, wherein the receiver-side A/D converter can respectively be associated with one of the channels K1 through K16.

Here as well as down-mixing of the acquired magnetic resonance signals (more precisely once uninverted and once inverted) ensues on the part of the local coil LS. The local oscillator frequencies LO1 and LO2 that are used therefore lie one above and one below the frequency of the magnetic resonance signals MR1 and MR2.

Digitized signals DS1 and DS2 appear uninverted and in the same baseband fB after the sampling has occurred at the receiver.

Figure 4:
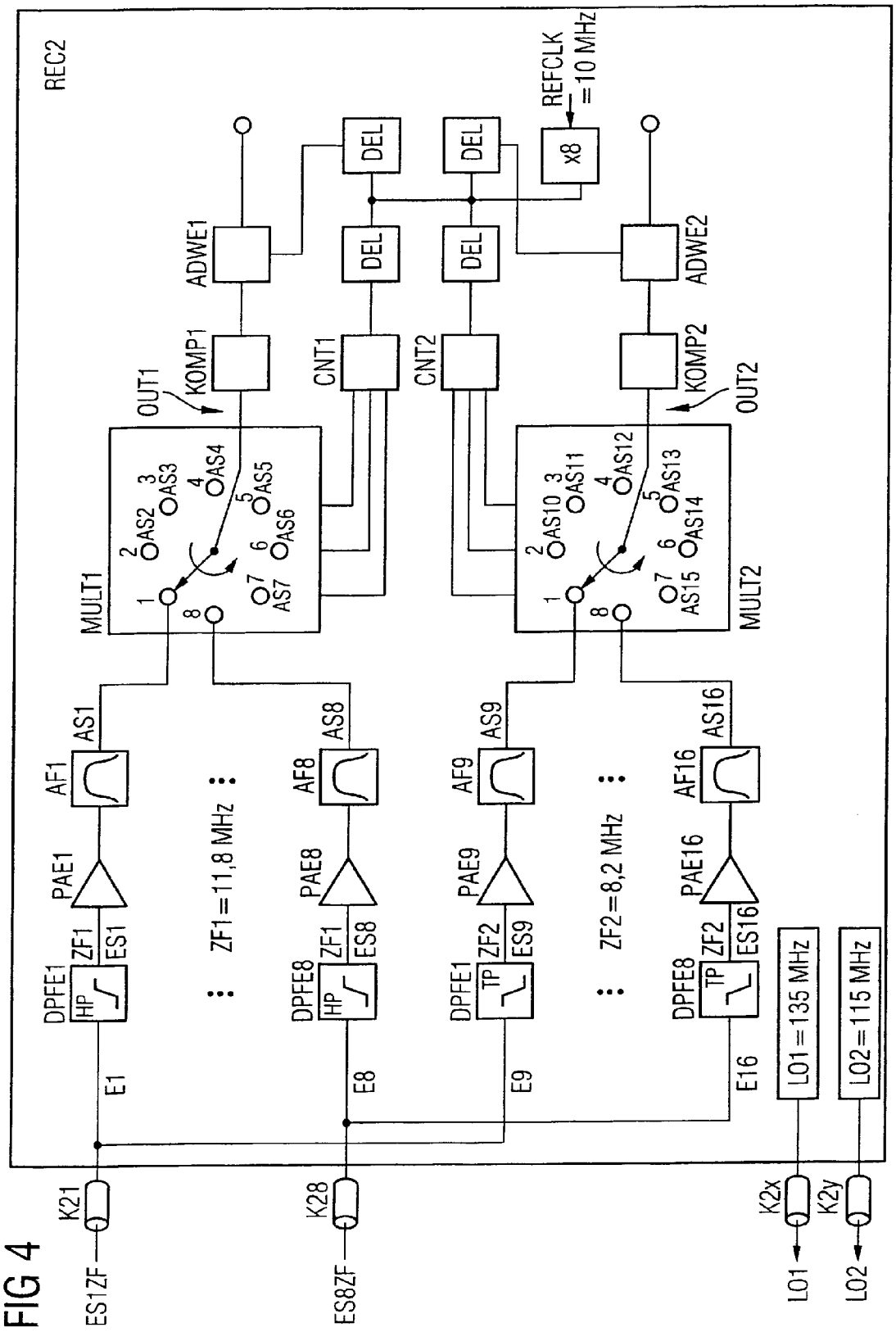
FIG. 4 is a block diagram, with reference to FIG. 3, of a second embodiment of a receiver according to the invention.

FIG. 4 shows a second receiver REC2 according to the invention in a principle representation and with reference to FIG. 3.

The receiver REC2 possesses sixteen (acquisition) branches or, respectively, channels E1 through E16 in total.

The branches E1 through E8 are identically designed; a first branch E1 and an eighth branch E8 are therefore representatively described in the following:

The first branch E1 contains a series circuit made up of a high-pass branch HP of a first diplex filter DPFE1, a first amplifier PAE1 and a first aliasing filter AF1.

On the reception side the first transmission signal SS1ZF forms a first acquisition signal ES1ZF that arrives at the first branch E1.

A first signal portion in the intermediate-frequency range ZF1=11.8 MHz is filtered out of the acquisition signal ES1ZF with the aid of the high-pass branch HP of the first diplex filter DPFE1, and a first acquisition signal ES1 is thus formed. This is subsequently directed to the aliasing filter AF1 via the amplifier PAE1.

This forms a first output signal AS1 of the branch E1 that arrives at a first input 1 of a first multiplexer MULT1.

The eighth branch E8 contains a series circuit made up of a high-pass branch HP of an eighth diplex filter DPFE8, an eighth amplifier PAE8 and an eighth aliasing filter AF8.

On the reception side the eighth transmission signal SS8ZF forms an eighth acquisition signal ES8ZF that arrives at the eighth branch E8.

A first signal portion in the intermediate-frequency range ZF1=11.8 MHz is filtered out of the acquisition signal ES8ZF with the aid of the high-pass branch HP of the eighth diplex filter DPFE8, and an eighth acquisition signal ES1 is thus formed. This is subsequently directed to the aliasing filter AF8 via the amplifier PAE8.

This forms an eighth output signal AS8 of the eighth branch E8 that arrives at an eighth input 8 of the first multiplexer MULT1.

The branches E9 through E16 are identically designed; a ninth branch E9 and a sixteenth branch E16 are therefore representatively described in the following:

The ninth branch E9 contains a series circuit made up of a low-pass branch of the first diplex filter DPFE1, a ninth amplifier PAE9 and a ninth aliasing filter AF9.

The first acquisition signal ES1ZF arrives not only at the first branch E1 but also at the ninth branch E9. A second signal portion in the intermediate-frequency range ZF2=8.2 MHz is filtered out of the acquisition signal ES1ZF with the aid of the low-pass branch TP of the first diplex filter DPFE1, and a ninth acquisition signal ES9 is thus formed. This is subsequently directed to the aliasing filter AF9 via the amplifier PAE9.

This forms a ninth output signal AS9 of the branch E9 that arrives at a first input 1 of a second multiplexer MULT2.

The sixteenth branch E16 contains a series circuit made up of a low-pass branch of the first diplex filter DPFE8, a sixteenth amplifier PAE16 and a sixteenth aliasing filter AF16.

The eighth acquisition signal ES8ZF arrives not only at the eighth branch E8 but also at the sixteenth branch E16. A second signal portion in the intermediate-frequency range ZF2=8.2 MHz is filtered out of the acquisition signal ES8ZF with the aid of the low-pass branch TP of the eighth diplex filter DPFE8, and a sixteenth acquisition signal ES16 is thus formed. This is subsequently directed to the aliasing filter AF16 via the amplifier PAE16.

This forms a sixteenth output signal AS16 of the sixteenth branch E16 that arrives at an eighth input 8 of the second multiplexer MULT2.

The branches E2 through E7 are designed and wired comparable to branch E1, such that the following input assignment results in the first multiplexer MULT1:
MULT1:

| Input 1 | Input 2 | Input 3 | Input 4 | Input 5 | Input 6 | Input 7 | Input 8 |
|---------|---------|---------|---------|---------|---------|---------|---------|
| AS1     | AS2     | AS3     | AS4     | AS5     | AS6     | AS7     | AS8     |

The branches E10 through E15 are designed and wired comparable to branch E9, such that the following input assignment results in the first multiplexer MULT2:
MULT2:

| Input 1 | Input 2 | Input 3 | Input 4 | Input 5 | Input 6 | Input 7 | Input 8 |
|---------|---------|---------|---------|---------|---------|---------|---------|
| AS9     | AS10    | AS11    | AS12    | AS13    | AS14    | AS15    | AS16    |

An output OUT1 of the first multiplexer MULT1 is connected via a first compressor KOMP1 with a first analog-digital converter ADWE1 with whose help a signal conversion into baseband ensues.

The first analog-digital converter ADWE1 is associated with the channels K1 through K8 of the local coil LS and therefore possesses the sampling frequency FS, comparable to FIG. 1 or to FIG. 3.

An output OUT2 of the second multiplexer MULT2 is connected via a second compressor KOMP2 with a second analog-digital converter ADWE2 with whose help a signal conversion into baseband ensues.

The second analog-digital converter ADWE2 is associated with the channels K9 through K16 of the local coil LS and therefore possesses the sampling frequency FS, comparable to FIG. 1 or, respectively, to FIG. 3.

The two multiplexers MULT1, MULT2 are connected with the aid of a multiplier ×8, with the aid of delay elements DEL and with the aid of two counters CNT1, CNT2, wherein a clock frequency REFCLK=10 MHz serves as a clock source.

The local oscillator frequencies LO1, LO2 used in the two Figures FIG. 3 and FIG. 4 exemplarily possess the following frequencies: LO1=135 MHz and LO2=115 MHz.

FIG. 5 shows a third receiver REC3 according to the invention in a principle representation.

Here it is assumed that combined signals of two local coil channels are transmitted via one transmission link ÜBS (which is designed as a connection cable, for example), comparable to FIG. 1 or comparable to FIG. 3.

The first branch EZ1 contains an intermediate-frequency bandpass ZFBP and a power splitter LT that is preferably designed as a 3 dB power splitter.

Furthermore, it contains an IQ modulator IQM, two bandpasses BP, two analog-digital converters ADW21, ADW22, a phase shifter PSS, a summation device SUM and a difference device DIF.

The transmission signal SS1ZF known from FIG. 3 is transmitted via the transmission link ÜBS and forms at the receiver a first acquisition signal ES1ZF that arrives at the intermediate-frequency bandpass ZFBP.

The intermediate-frequency bandpass ZFBP possesses a throughput frequency range from 7.5 MHZ to 12.5 MHz for the aforementioned intermediate-frequency ranges ZF1, ZF2. Two identical signals ES211ZF and ES212ZF are formed with the aid of the power splitter LT.

A first signal ES211ZF arrives via a first input of the IQ modulator IQM for IQ demodulation that is conducted with the aid of a cosinusoidal 10 MHz oscillator frequency. A signal ESI is therefore formed in the baseband fB, which signal ESI arrives at a first analog-digital converter ADW21 via a bandpass BP.

This A/D converter ADW21 in turn executes a sampling with the frequency FS.

A second signal ES212ZF arrives via a second input of the IQ modulator IQM for IQ demodulation that is conducted with the aid of a sinusoidal 10 MHz oscillator frequency. A signal ESQ is therefore formed in the baseband fB, which signal ESQ arrives at a second analog-digital converter ADW22 via a bandpass BP.

This A/D converter ADW22 in turn executes a sampling with the frequency FS.

Respective digital output signals of the two analog-digital converters ADW21, ADW22 are added or, respectively, subtracted using the 90° phase shifter PSS. The digital 90° phase shifter is fashioned as what is known as a "Hilbert filter" and, with the addition or, respectively, subtraction of the signals, serves for the explicit splitting of the signals of the two channels of the local coil.

After the actual image reconstruction conducted separately for each channel, a per-pixel, complex, weighted superimposition of the images from different channels is typically conducted (image combination). The digital Hilbert filter and the following calculation of sum and difference that are used for the explicit separation of upper and lower sideband can therefore be omitted in a simplified embodiment of FIG. 5, and the I and Q output signals are fed directly from ADW21 and ADW22 into the image reconstructions (CH1 and CH2). Different weighting factors are necessary only for the image combination. However, since the weighting factors are typically derived from the MR data themselves, no additional adaptation to such an acquisition system is necessary.

FIG. 6 shows a fourth receiver REC4 according to the invention in a principle representation.

Here it is assumed that that combined signals of two local coil channels are transmitted via one transmission link ÜBS (which is designed as a connection cable, for example), comparable to FIG. 1, FIG. 3, and comparable to FIG. 5.

The receiver REC4 possesses four aliasing filters AF61 through AF64 in total.

For better illustration, reference is made to FIG. 3 as an example, such that the combined signals of two local coil channels arrive at a first aliasing filter AF61 (here the signals of the channels K1 and K9 shown in FIG. 3, for example).

The combined signals of the local coil channels K2 and K10 correspondingly arrive at a second aliasing filter AF62, the combined signals of the local coil channels K3 and K11 arrive at a third aliasing filter AF63 and the combined signals of the local coil channels K4 and K12 arrive at a fourth aliasing filter AF64.

The aliasing filters AF61 through AF64 are connected at the output side with a multiplexer MULT61, such that output signals AS61 through AS64 formed by the aliasing filters arrive at associated inputs 1 through 4 of the multiplexer MULT61.

The inputs 1 through 4 of the multiplexer MULT61 are connected as follows to the output OUT61 of said multiplexer MULT61: 1-2-1-2-3-4-3-4.

The output OUT61 is connected via a downstream compression KOMP61 with an A/D converter ADWE61 that in turn conducts a sampling with the sampling frequency FS.

The aliasing filters AF61 through AF64 pass both sidebands (here 7.5 MHz to 12.5 MHz, for example) but block below 2.5 MHz and above 17.5 MHz.

The A/D converter ADWE61 receives samples offset by 25 ns (corresponding to 900 at 10 MHz). Given an 80 MHz sampling rate, pairs of every second sample thus always belong to a common frequency multiplexer channel pair and form a pair of IQ data, similar to as in FIG. 5.

Here as well the samples can be fed directly into 8 image processing channels without using a digital Hilbert filter.

FIG. 7 shows a fifth receiver REC5 according to the invention in a principle representation. It operates entirely analogous to the REC 4 shown in FIG. 6, but only for four (instead of eight) channels that were transferred with two instead of four lines.

Here it is again assumed that combined signals of two local coil channels are transferred via a transmission link (fashioned as a connection cable, for example), comparable to FIG. 1, FIG. 3, and comparable to FIG. 5.

The receiver REC 5 has two aliasing filters AF71 and AF72 in total.

For better illustration, here exemplary reference is made to FIG. 3, such that the combined signals of two local coil channels—here the signals of the channels K1 and K8 shown in FIG. 3, for example—arrive at a first aliasing filter AF71. The combined signals of the local coil channels K2 and K10 correspondingly arrive at a second aliasing filter AF72.

The two aliasing filters AF71, AF72 are connected at the output side with a multiplexer MULT71, such that output signals AS71 through AS72 formed by the aliasing filters arrive at associated inputs 1 and 2 of the multiplexer MULT71.

The inputs 1 and 2 of the multiplexer MULT71 are connected as follows to the output OUT71 of the multiplexer MULT71: 1-1-2-2.

The output OUT71 is connected via a downstream compressor KOMP71 with an A/D converter ADWE71 that in turn conducts a sampling with the sampling frequency FS.

The A/D converter ADWE71 receives samples offset by 25 ns (corresponding to 90° at 10 MHz). Sample pairs in direct succession result given a sampling rate of 40 MHz.

The aliasing filters AF71, AF72 pass both sidebands (here 7.5 MHz to 12.5 MHz) but block below 2.5 MHz and above 17.5 MHz.

Here the samples can be fed directly to 4 image processing channels without using a digital Hilbert filter.

FIG. 8 shows a sixth receiver REC6 according to the invention in a principle representation.

Here it is assumed that combined signals from four local coil channels are transmitted via one transmission link (which is designed as a connection cable, for example), wherein four intermediate-frequency ranges are used on the part of the local coil—more precisely the 8.2 MHz and 11.8 MHz known from previous Figures and two additional ranges, namely 1.8 MHz and 18.2 MHz.

The receiver REC6 has a low-pass TP81 at which the intermediate-frequency signals arrive.

The low-pass TP81 is connected at the output side with an A/D converter ADWE81 via a downstream compressor KOMP81, which analog-digital converter ADWE81 in turn conducts a sampling with the sampling frequency FS.

In the receiver REC6, all intermediate-frequencies lie in a first, distinct Nyquist band below half of the sampling frequency of the ADC.

For the image reconstructions, the ADC data stream is then divided up into four channels with a 10 MHz sampling rate each. Due to the symmetrical positioning of the intermediate-frequencies at 0, 10 and 20 MHz according to the invention, the signals of the four coils spectrally overlap in each individual data stream. However, they differ in their relative phase. The information about the differences of the input signals for the image combination is therefore not lost.

The phases of the sampling values in the channel data streams are shown by way of example in the following table for intermediate-frequencies of 2, 8, 12 and 18 MHz (common baseband frequency of 2 MHz):

| Channel Nr. | 1 | 2 | 3 | 4 | 1 | 2 | 3 | 4 | ... |
|---|---|---|---|---|---|---|---|---|---|
| 2 MHz | 0° | 18° | 36° | 54° | 72° | 90° | 108° | 126° | ... |
| 8 MHz | 0° | 72° | 144° | 216° | 288° | 0° | 72° | 144° | ... |
| 12 MHz | 0° | 108° | 216° | 324° | 72° | 180° | 288° | 36° | ... |
| 18 MHz | 0° | 162° | 324° | 126° | 288° | 90° | 252° | 54° | ... |

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for transmitting magnetic resonance signals comprising:
    a local coil configured to receive analog magnetic resonance signals;
    a receiver configured to convert said analog magnetic resonance signals into digital signals;
    a transmission link placing said local coil in communication with said receiver to transmit said analog magnetic resonance signals to said receiver;
    said local coil comprising a first channel comprising a first single antenna that acquires a first analog magnetic resonance signal, and a first mixer connected to said first single antenna, said first mixer being configured to form an intermediate-frequency first analog signal from said first analog magnetic resonance signal;

said local coil comprising a second channel comprising a second single antenna configured to receive a second analog magnetic resonance signal, and a second mixer connected to said second single antenna, said second mixer forming an intermediate frequency second analog signal from said second analog magnetic resonance signal;

said local coil comprising a signal combiner configured to combine said intermediate frequency first analog signal of said first channel and said intermediate frequency second analog signal of said second channel by frequency multiplexing to produce said analog magnetic resonance signal that is communicated via said transmission link to said receiver;

said receiver comprising an analog-to-digital converter that samples the transmitted intermediate frequency signals with a sampling frequency to produce said digital signal;

for frequency conversion into a first intermediate frequency range, said first mixer being supplied with a first local oscillator signal, and for frequency conversion into a second intermediate frequency range, said second mixer being supplied with a second local oscillator frequency; and said first and second local oscillator frequency respectively causing the respective intermediate frequencies formed by the frequency conversion in the first and second mixers to be mirror symmetric relative to said sampling frequency of said analog-to-digital converter.

2. Arrangement according to claim 1, wherein
the first local oscillator frequency is selected below a frequency of the acquired magnetic resonance signals, such that a down-mixing of the first magnetic resonance signal ensues in an uninverted state and
the second local oscillator frequency is selected above a frequency of the acquired magnetic resonance signals, such that a down-mixing of the second magnetic resonance signal ensues in an inverted state.

3. Arrangement according to claim 1, wherein the device for signal combination is connected on the input side with associated outputs of the modulators and on the output side with the transmission link, such that an intermediate-frequency transmission signal is formed from the intermediate-frequency signals of the channels and transmitted to the receiver.

4. Arrangement according to claim 3 wherein the device for signal combination is designed as a diplex filter.

5. Arrangement according to claim 3 wherein the receiver possesses a device for signal splitting that forms from the received intermediate-frequency transmission signal an intermediate-frequency first signal that can be associated with the first channel an intermediate-frequency second signal that can be associated with the second channel.

6. Arrangement according to claim 5 wherein
the device for signal splitting is connected on the output side with an A/D converter associable with the first channel, such that the intermediate-frequency first signal associable with the first channel is sampled with the sampling frequency, and
the device for signal splitting is connected on the output side with an A/D converter associable with the second channel, such that the intermediate-frequency second signal associable with the second channel is sampled with the sampling frequency.

7. Arrangement according to claim 5 wherein the device for signal splitting is designed as a diplex filter or as an modulator.

8. Arrangement according to claim 3, wherein the receiver comprises a multiplexer supplied at an input side thereof with the intermediate-frequency transmission signal transmitted by frequency multiplexing, said multiplexer being connected at an output side thereof with the A/D converter (ADWE61).

9. Arrangement according to claim 1, comprising at least one of an amplifier or a bandpass filter interposed between the single antenna and the mixer.

* * * * *